United States Patent [19]

Russo

[11] Patent Number: 4,503,087

[45] Date of Patent: Mar. 5, 1985

[54] PROCESS FOR HIGH TEMPERATURE DRIVE-IN DIFFUSION OF DOPANTS INTO SEMICONDUCTOR WAFERS

[75] Inventor: Carl J. Russo, Ipswich, Mass.

[73] Assignee: Varian Associates, Inc., Palo Alto, Calif.

[21] Appl. No.: 527,140

[22] Filed: Aug. 29, 1983

[51] Int. Cl.³ .............................................. B05D 3/06
[52] U.S. Cl. .................................... 427/55; 118/641; 373/110; 427/85; 427/372.2
[58] Field of Search ................. 427/55, 53.1, 46, 45.1, 427/85, 372.2; 118/641; 373/158, 110

[56] References Cited

U.S. PATENT DOCUMENTS

| | | | |
|---|---|---|---|
| 3,901,183 | 8/1975 | Wittkower | 118/49.1 |
| 3,954,191 | 5/1976 | Wittkower et al. | 214/17 B |
| 4,017,967 | 4/1977 | Wells et al. | 427/372.2 |
| 4,041,278 | 8/1977 | Boah | 118/641 |
| 4,417,347 | 11/1983 | Muka et al. | 373/158 |
| 4,421,477 | 12/1983 | Muka et al. | 373/158 |

OTHER PUBLICATIONS

Fulks et al., *Appl. Phys. Lett.*, vol. 39, No. 8, Oct. 1981, pp. 604–606.
Kugimiya et al., "Blink Furnace Annealing of Ion Implanted Silicon," *Jap. J. Appl. Phys.*, vol. 21, No. 1, Jan. 1982, pp. L16–L18.
Downey et al., "Activation and Process Characteristics of Infra-Red Rapid Isothermal and Furnace Annealing Techniques," Solid State Technology, Sep. 1982.
Russo et al., "Rapid Isothermal Annealing For Semiconductor Applications: Aspects of Equipment Design," *Ion Implantation: Equipment and Techniques*, Springer-Verlag, 1983.
Isu et al., "Rapid Annealing of Ion Implanted Silicon by Photon Beam Radiation," 14th Symposium on Ion Implantation and Submicron Fabrication, Feb. 2–4, 1983.
Fair, "Concentration Profiles of Diffused Dopants in Silicon," *Impurity Doping*, edited by F. F. Y. Wang, North Holland, 1981, pp. 338–345.
Sedgwick, "Short Time Annealing," *J. Electrochem. Soc.: Solid State Science and Technology*, vol. 130, No. 2, Feb. 1983, p. 484.

Primary Examiner—John H. Newsome
Attorney, Agent, or Firm—Stanley Z. Cole; William R. McClellan

[57] ABSTRACT

A process for high temperature, rapid drive-in diffusion employs a planar blackbody source placed in parallel alignment with a semiconductor wafer in a vacuum processing chamber. The wafer is rapidly heated, preferably to a temperature in the range of 1100° C. to 1300° C. and primarily by radiation which promotes uniformity. Typical diffusions are completed in less than one minute. In order to control diffusion distance at elevated temperatures, the process time and source temperature are carefully controlled, and the peak wafer temperature is monitored.

9 Claims, 4 Drawing Figures 4,503,087

PROCESS FOR HIGH TEMPERATURE DRIVE-IN DIFFUSION OF DOPANTS INTO SEMICONDUCTOR WAFERS

BACKGROUND OF THE INVENTION

This invention relates to processing of semiconductor wafers and, more particularly, to a process for accurately controlled, high temperature drive-in diffusion of dopant impurities into a semiconductor wafer.

Diffusion is a well-known technique for producing impurity doped regions in semiconductor wafers. In the conventional approach, a batch of wafers is placed in a diffusion furnace and exposed to a gaseous form of the impurity species which is deposited on or near the wafer surface. The wafer is then subjected to drive-in diffusion, usually in another diffusion furnace. An inert gas at a temperature of 900° C. to 1050° C. flows through the furnace and causes the impurity atoms to diffuse into selected regions of the wafer not protected by oxide layers. The depth of diffusion depends on impurity concentration, temperature and time in the furnace. For the above temperature range, diffusion time is typically on the order of thirty minutes.

Long-standing problems with diffusion furnaces have been poor impurity uniformity over the surface of the wafer and poor control of impurity dosage. As integrated circuit devices become smaller and more dense, these problems limit the usefulness of the diffusion furnace.

Implantation of ions into semiconductor wafers is a doping technique which alleviates these problems. Doping uniformity and dosage can both be accurately measured and controlled. However, ion implantation is limited, due to energy considerations, in the depth to which impurity dopants can be deposited. To address this problem, a technique involving predeposition ion implantation followed by drive-in diffusion has been developed. Ions are implanted at moderate energies into the near surface region of the wafer and then processed in a diffusion furnace in order to drive the impurities to a greater depth and to anneal the radiation damage due to the implant. This technique permits good control of dosage and uniformity.

One drawback of drive-in diffusion, whether employed after vapor deposition or ion implantation, is the time required for the process. The diffusion process typically requires thirty or more minutes, and additional time is required for transferring the wafers in and out of the furnace. In a commercial semiconductor processing environment, any reduction in processing time is highly advantageous. It is known that the rate of diffusion of impurities into semiconductor material increases with temperature and, more particularly, that the diffusion constant is an exponential function of temperature. However, due to the nature of diffusion furnaces, it has not been possible to increase the operating temperature in order to reduce the processing time. Diffusion furnaces have large thermal masses and are maintained at operating temperature. The movement of wafers in and out of the furnace is done slowly to avoid wafer cracking and breakage due to thermal stresses. This creates an uncertainty in the time that the wafers are exposed to the high temperature. Differences in time at high temperature produce differences, or errors, in the diffusion of impurities. An increase in the operating temperature of the diffusion furnace increases these errors to an intolerable level since the processing time is decreased but the source of timing error is unchanged.

It is a general object of the present invention to provide a process for high temperature drive-in diffusion.

It is another object of the present invention to provide a process wherein the rate of drive-in diffusion is increased.

It is yet another object of the present invention to provide an accurately controlled process for high temperature drive-in diffusion.

It is still another object of the present invention to provide a process for drive-in diffusion wherein a semiconductor wafer is exposed to a planar radiation source.

SUMMARY OF THE INVENTION

According to the present invention, these and other objects and advantages are achieved in a process for high temperature drive-in diffusion of dopants deposited on or near the surface of a semiconductor wafer. The process comprises providing a radiation source having a relatively uniform planar energy flux characteristic and directing an intense beam of radiation from the source to the wafer and the dopants. The beam is directed at the wafer at a power level sufficient to raise the temperature of the wafer and the dopants to between 1000° C. and 1350° C. for a time selected to produce a prescribed amount of dopant diffusion.

BRIEF DESCRIPTION OF THE DRAWINGS

For a better understanding of the present invention, together with other and further objects, advantages and capabilities thereof, reference may be had to the accompanying drawings which are incorporated herein by reference and in which.

DETAILED DESCRIPTION OF THE INVENTION

The process of the present invention employs a radiation source which provides generally uniform heating of a semiconductor wafer to a temperature in the range between 1000° C. and 1350° C., and preferably in the range between 1100° C. and 1300° C., for a controlled time. By utilizing temperatures in this range, drive-in diffusion is accomplished in times on the order of a few seconds to a few minutes, depending on the parameters of the diffusion. The preferred temperature range provides suitably rapid processing while remaining well below the melting point of silicon wafers. Conventional diffusion furnaces require times on the order of thirty minutes or more to perform the equivalent drive-in diffusion. Thus, the present invention provides better than an order of magnitude improvement in processing times. The radiation source is typically a planar blackbody source, and the wafer is placed in parallel alignment with the source. An important feature of the present invention, controlling the time and temperature of the process so as to provide predictable and controlled diffusion, is described hereinafter.

Figure 1:
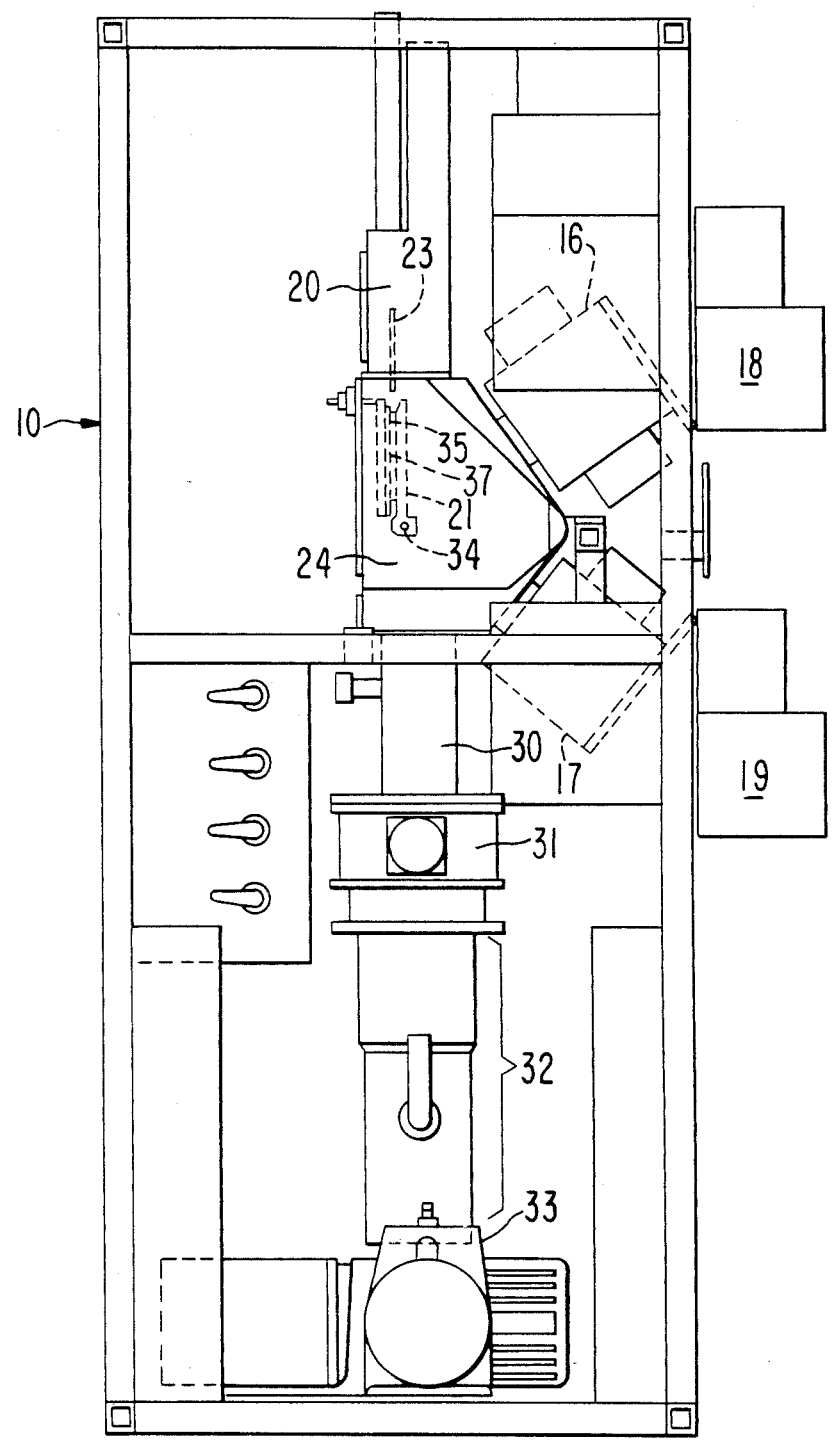
FIG. 1 is a side view of one type of thermal processor apparatus utilized to practice the method of the present invention.
Figure 2:
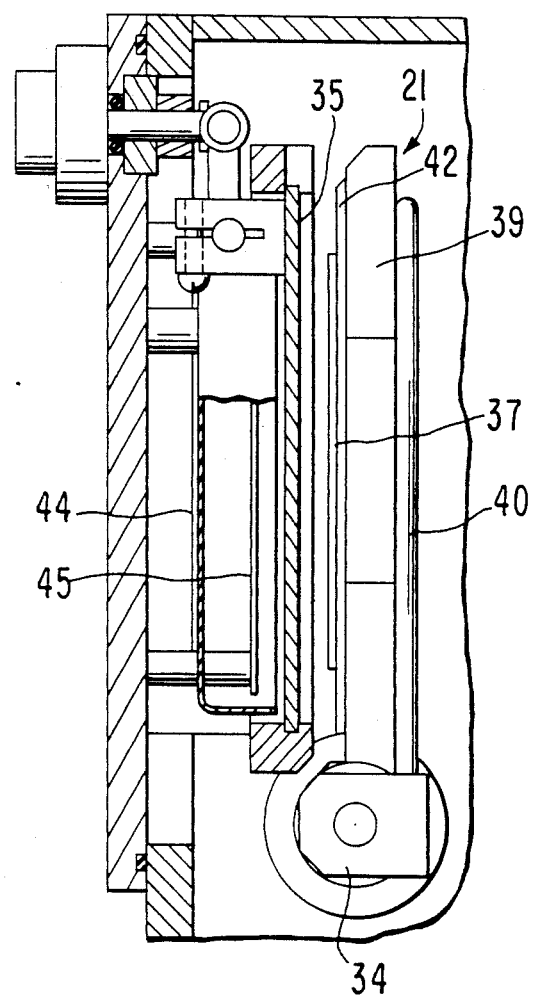
FIG. 2 is a cross-sectional partially broken away view of a platen for holding a semiconductor wafer in the processor apparatus of FIG. 1.

A thermal processor apparatus suitable for carrying out the method of the present invention is illustrated in FIGS. 1 and 2. The processor is configured to receive, thermally treat and discharge semiconductor wafers. Processor apparatus 10 is shown in FIG. 1 in simplified form and is generally representative of the IA-200 Rapid Thermal Processor manufactured and sold by the Extrion Division of Varian Associates, Inc. The apparatus utilizes a WayFlow TM gravity-in, gravity-out wafer handler, as described in U.S. Pat. No. 3,901,183, issued Aug. 26, 1975, to Wittkower for insertion and removal of silicon wafers. In the WayFlow TM wafer handler, a wafer is inserted from a cassette placed in cassette holder 18 through an entrance lock 16 (see U.S. Pat. No. 3,954,191, issued May 4, 1976, to Wittkower et al) into vacuum chamber 24, 20. A platen 21 is rotated about an axis 34 into alignment with the lock 16. The wafer slides by gravity feed onto the platen 21 which is then rotated about axis 34 to a processing position in opposition to a blackbody source 35.

The preferred blackbody source 35 is a resistive material, such as graphite, which is cut into a planar shape containing a serpentine pattern of strips and is energized by a controllable power source (not shown). This source produces radiation across a broad bandwidth, with a peak in the infrared and substantial components in the visible spectrum. Alternatively, a lamp source having a uniform planar energy flux characteristic can be utilized. The blackbody source 35 may be shuttered by a shutter plate 23 until the platen 21 brings the wafer into position. Alternatively, the source 35 may be on but idled at lower power until the wafer is in place. The distance between the wafer 37 and the blackbody source 35 (FIG. 2) may vary from about ¼ inch to as far as practicable. The actual distance is determined by uniformity requirements and the space taken up by the shutter 23. For uniformity, the source 35 and the wafer 37 are positioned in approximately parallel alignment. Furthermore, the active area of the source 35 is preferably at least as large as the wafer 37, since the viewing factor from the source to wafer must be as high and uniform as possible. The temperature of the blackbody source 35 is typically between 1100° C. and 1450° C. to accomplish drive-in diffusion in accordance with the present invention. The processing time typically varies between 8 and 60 seconds. Heating is radiative so that the wafer 37 increases in temperature until at equilibrium it is nearly at the temperature of the source 35.

To promote uniform heating, it is desired to heat primarily by radiation rather than convection. With conventional furnace processing, heating is accomplished in large part by convection of the gaseous ambient; such heating is not uniform due to thermally induced gas currents. In the process of the present invention, control is maintained over the pressure at least between the source and the wafer. The pressure in this region is controlled within the range of $10^{-7}$ Torr to ambient. Preferably, the pressure during processing is in the range of $1 \times 10^{-6}$ Torr and $5 \times 10^{-5}$ Torr. It is acceptable to utilize inert gases in the above pressure ranges during processing. As shown in FIG. 1, a mechanical roughing pump 33 is used in series with a diffusion pump 32 to evacuate chamber 24 through tube 30 and baffle 31 and thereby control the pressure therein.

After drive-in diffusion is completed, the source 35 is shuttered by the shutter plate 23 or is idled or shut off. The platen 21 is rotated downwardly into alignment with an exit lock 17, and the wafer is removed through the exit lock 17 into a cassette in a cassette holder 19. If the wafer is silicon, it is preferably cooled down to 700° C. or less before being removed from the chamber 24. This can be accomplished by actively cooling the platen 21 or by rotating the platen 21 so that the wafer 37 radiates to the walls of the chamber 24 which appear as a blackbody sink. As shown in FIG. 2, the platen 21 is comprised of a metal block 39 having coiled cooling tubes 40 affixed to the back thereof. The cooling tubes 40 contain chilled water, or other coolant, and are connected by feedthroughs (not shown) to a source external to the chamber. On the front side of the platen 21, to foster uniform heating, a circumferential strip 42 made from a refractory metal is provided. This strip may be heated to insure a uniform temperature profile between the edges of the wafer and the center. Planar shields 44 and 45 are also positioned between the thermal source 35 and the walls of the vacuum chamber 24. These shields reduce thermal losses in accordance with the formula $1/(n+1)$ where n is the number of shields in succession, providing there is a vacuum separation between each shield.

In general, the distance $\Delta x$ in one dimension by which a dopant diffuses in a substrate is given approximately by:

$$\Delta x \simeq [2Dt]^{\frac{1}{2}}$$

where
t = processing time
$D = D_o \exp[-E_A/kT]$
$D_o$ = diffusion coefficient at infinite temperature
$E_A$ = activation energy
k = Boltzman's constant
T = processing temperature.

The diffusion distance $\Delta x$ also varies with dopant concentration. Since the temperature dependence of the diffusion coefficient D is exponential, moderate increases in temperature require large reductions in time to obtain the same diffusion distance. For example, an increase in processing temperature T from 1000° C. to 1200° C. provides an increase in D of 100 to 200 and requires a corresponding decrease in processing time t. Thus, a diffusion which requires thirty minutes in a furnace can be performed in less than one minute in accordance with the present invention.

In order to perform drive-in diffusion at the increased temperatures and reduced times described above, several requirements must be met: (1) The processing apparatus must raise the wafer to the required temperature very rapidly; (2) The wafer must be cooled very rapidly after the diffusion process is complete; (3) The heating must be uniform over the surface of the wafer to insure uniform diffusion and to avoid thermal stresses on the wafer; (4) The processing time and the processing temperature must be carefully controlled since the diffusion occurs at a faster rate than in prior art methods; and (5) Transient temperature effects must be accounted for since processing times are very short.

The thermal processing apparatus shown in FIGS. 1 and 2 and described hereinabove heats the wafer to nearly the temperature of the radiation source 35 a few seconds after the shutter plate 23 is raised. Similarly, the wafer cools to the range of 700° C. a few seconds after the shutter plate 23 is lowered and the platen 21 and the wafer are rotated away from the source 35. At 700° C., the diffusion rate is low enough to be negligible. The heating of the wafer is uniform due to the planar configuration and the large area of the source 35 and the positioning of the wafer close to the source 35. The reliance predominantly on radiative heating with a uniform blackbody also insures uniform wafer heating. The temperature is controlled by means of the power level applied to the source 35 and by measurements of source temperature which are used to control the power applied to the source 35. The processing time is controlled by the position of the shutter plate 23.

Figure 3:
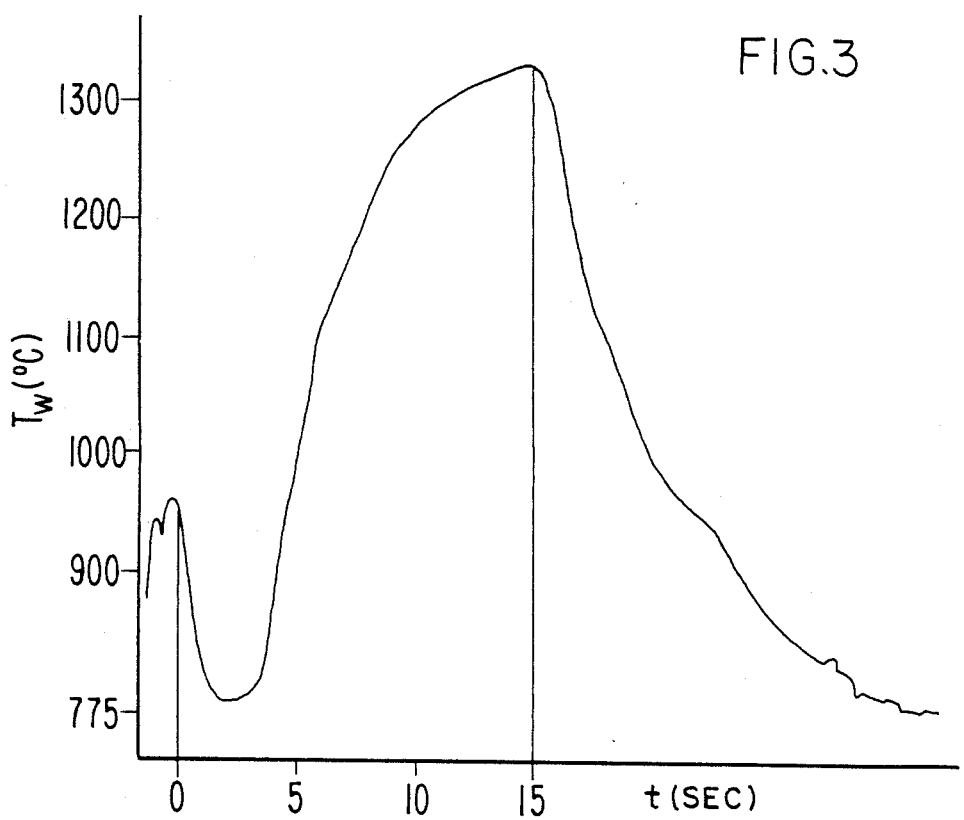
FIG. 3 is a graph illustrating wafer temperature as a function of time in the processor apparatus of FIG. 1.
Figure 4:
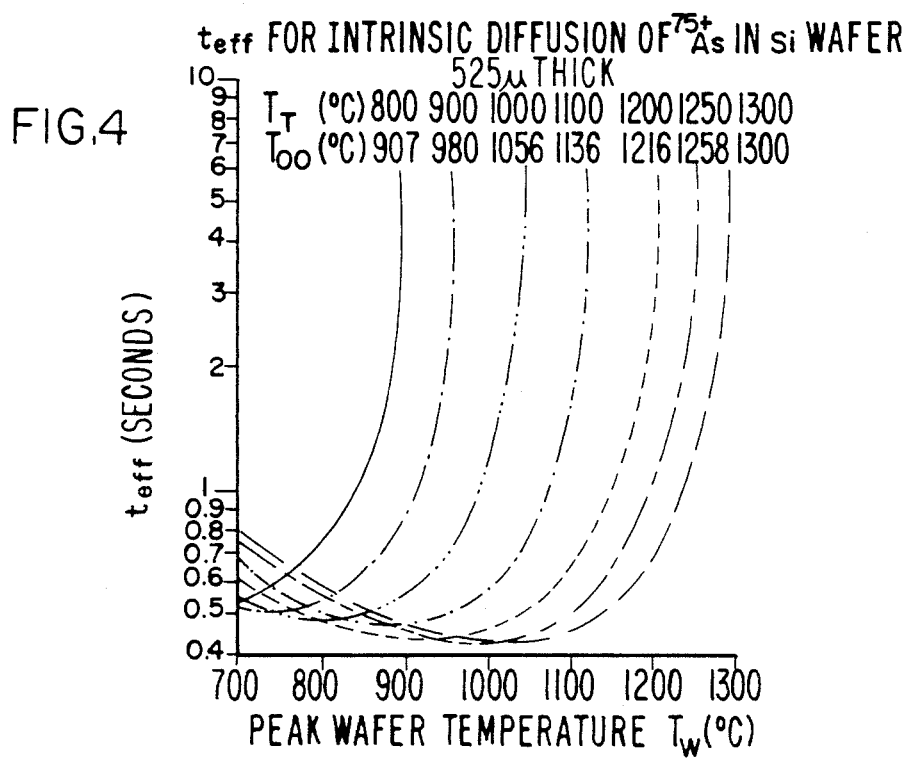
FIG. 4 is a graph illustrating $t_{eff}$ as a function of peak wafer temperature for the processor apparatus of FIG. 1.

When the shutter plate is raised from the position between the source 35 and the wafer, the wafer temperature rapidly increases toward the source temperature, as indicated in FIG. 3. After the shutter is lowered, the wafer rapidly cools. When the transient wafer temperature times are an appreciable portion of the total processing time, their effect must be accounted for. With reference to FIG. 3, the shutter is open for 15 seconds. However, the wafer temperature is increasing during that interval. From the configuration of the processing apparatus, an effective time $t_{eff}$ can be calculated or determined experimentally for a given wafer and dopant type. The values of $t_{eff}$ correspond to the minimum times the wafer is at the peak wafer temperature $T_w$ for the fastest heat up and cool down cycles. Longer times will be obtained with other time-temperature cycles. Calculated values of $t_{eff}$ are plotted in FIG. 4 as a function of peak wafer temperature $T_w$ for a series of source thermocouple temperature $T_T$ set points. In practice, the actual source temperature is approximately 100° C. hotter than the thermocouple temperature $T_T$ reading. Also indicated in FIG. 4 are the final temperatures $T_\infty$ reached by the wafer if exposed to the source for an infinite time. The effective time $t_{eff}$ represents an idealized step function heating cycle which produces the same diffusion effects as the nonideal processing apparatus. The peak wafer temperature $T_w$ is measured by an infrared detector.

In operation, a given source thermocouple temperature $T_T$ is set on the machine and the peak wafer temperature $T_w$ is observed. The value of $t_{eff}$ is then obtained from the graph of FIG. 4. Diffusion is then calculated as follows:

$$Dt = D_o \exp[-E_A/kT_w] \times t_{eff}$$

and $$\Delta x \simeq [2Dt]^{\frac{1}{2}}.$$

Concentration dependent effects typically make $\Delta x$ values larger than the instrinsic values calculated above, particularly for the rapidly processed case.

A batch of <111> silicon wafers was implanted with $^{75}As^+$ at 100 KeV, $1 \times 10^{16}/cm^2$. Wafers from the batch were treated in accordance with the present invention in the apparatus illustrated in FIGS. 1 and 2 with $T_T$ approximately 1350° C., $T_w$ approximately 1300° C. and time of treatment approximately 10 seconds. With these paramters, the impurity redistribution was $\Delta x \simeq 0.13$ micrometer. For comparison, wafers from the batch were treated in a furnace for 60 minutes at 900° C. The impurity redistribution was $\Delta x \simeq 0.03$ micrometer.

While there has been shown and described what is at present considered the preferred embodiments of the invention, it will be obvious to those skilled in the art that various changes and modifications may be made therein without departing from the scope of the invention as defined by the appended claims.

I claim:

1. A process for high temperature drive-in diffusion of dopants deposited on or near the surface of a semiconductor wafer, comprising:
   providing a radiation source having a relatively uniform planar energy flux characteristic; and
   directing an intense beam of radiation from said source to said wafer and said dopants at a power level sufficient to heat said wafer and said dopants uniformly through the thickness of said wafer to a temperature beteen 1000° C. and 1350° C. said temperature being below the temperature which produces melting of said wafer and said dopants for a time selected to produce a prescribed amount of dopant diffusion.

2. A process as defined in claim 1 wherein said step of providing a radiation source includes proving a planar blackbody source.

3. A process as defined in claim 2 wherein said step of providing a radiation source includes providing a planar graphite heater.

4. A process as defined in claim 2 further including the step of positioning said wafer in parallel, spaced-apart alignment with said planar blackbody source.

5. A process as defined in claim 4 further including the step of controlling the pressure in the region between said source and said wafer to provde predominantly radiative heating of said wafer.

6. The process as defined in claim 5 further including the step of controlling said dopant diffusion by operating said source during said process at a predetermined temperature and monitoring the peak temperature of said wafer during said process whereby the transient temperature response of said wafer and the corresponding dopant diffusion can be determined.

7. The process as defined in claim 6 wherein said beam of radiation from said source is directed at said wafer for a time in the range of 8 to 60 seconds.

8. The process as defined in claim 1 wherein said step of providing a radiation source includes providing a lamp source.

9. The process as defined in claim 1 wherein the temperature of said wafer and said dopants is controlled in the range between 1100° C. and 1300° C.

* * * * *